(12) United States Patent
Togashi et al.

(10) Patent No.: US 8,325,489 B2
(45) Date of Patent: Dec. 4, 2012

(54) ELECTRONIC COMPONENT MOUNTING STRUCTURE

(75) Inventors: Masaaki Togashi, Tokyo (JP); Kouji Yamada, Tokyo (JP)

(73) Assignee: TDK Corporation, Tokyo (JP)

(*) Notice: Subject to any disclaimer, the term of this patent is extended or adjusted under 35 U.S.C. 154(b) by 208 days.

(21) Appl. No.: 12/941,265

(22) Filed: Nov. 8, 2010

(65) Prior Publication Data

US 2011/0110060 A1 May 12, 2011

(30) Foreign Application Priority Data

Nov. 11, 2009 (JP) ................. P2009-257947

(51) Int. Cl.
*H05K 7/00* (2006.01)

(52) U.S. Cl. ............ 361/782; 361/760; 361/306.1; 361/301.1; 361/301.4; 174/261

(58) Field of Classification Search .......... 174/260–261; 361/301.1, 301.4, 306.1, 728, 734, 742, 758, 361/770, 760, 782

See application file for complete search history.

(56) References Cited

U.S. PATENT DOCUMENTS

| | | | | |
|---|---|---|---|---|
| 6,191,933 B1* | 2/2001 | Ishigaki et al. | ........... | 361/309 |
| 6,563,691 B2* | 5/2003 | Kijima et al. | ........... | 361/328 |
| 6,704,189 B2* | 3/2004 | Yoshii et al. | ........... | 361/308.1 |
| 7,123,465 B2* | 10/2006 | Crane et al. | ........... | 361/306.2 |
| 7,580,269 B2* | 8/2009 | Li | ........... | 361/782 |
| 7,697,262 B2* | 4/2010 | Ritter et al. | ........... | 361/306.1 |
| 8,134,825 B2* | 3/2012 | Otsuka et al. | ........... | 361/306.3 |
| 2004/0183147 A1* | 9/2004 | Togashi et al. | ........... | 257/414 |
| 2007/0188975 A1* | 8/2007 | Togashi et al. | ........... | 361/306.3 |

FOREIGN PATENT DOCUMENTS

| | | |
|---|---|---|
| JP | A-7-321440 | 12/1995 |
| JP | A-2002-119069 | 4/2002 |
| JP | A-2004-282171 | 10/2004 |
| JP | A-2008-186962 | 8/2008 |

* cited by examiner

*Primary Examiner* — Hoa C Nguyen
(74) *Attorney, Agent, or Firm* — Oliff & Berridge, PLC

(57) ABSTRACT

An electronic component mounting structure which can reduce the ESL while saving the space when mounting electronic components is provided. A first electronic component 7 is electrically connected to surface-mounted electrode parts 11A, 12A at metal terminals 26, 27 such that a first capacitor 24 having a greater capacitance and a mounting surface 4a of a multilayer substrate 4 are separated from each other. A second electronic component 8 is arranged between the first capacitor 24 and the mounting surface 4a and electrically connected to surface-mounted electrode parts 12B, 11B at second terminal electrodes 32, 33. The second electronic component 8 overlaps the first capacitor 24 when seen in the laminating direction. The first electronic component 7 is mounted to the multilayer substrate 4 such that first terminal electrodes 22, 23 oppose each other in a predetermined direction D1. The second electronic component 8 is mounted to the multilayer substrate 4 such that the second terminal electrodes 32, 33 oppose each other in the predetermined direction D1.

4 Claims, 5 Drawing Sheets

Fig.4
PRIOR ART

ELECTRONIC COMPONENT MOUNTING STRUCTURE

BACKGROUND OF THE INVENTION

1. Field of the Invention

The present invention relates to an electronic component mounting structure having a capacitor.

2. Related Background Art

As an electronic component mounting structure, one comprising a first capacitor having both ends formed with terminal electrodes; a second capacitor having a capacitance greater than that of the first capacitor; and a multilayer substrate including a surface-mounted electrode part, an inner conductor layer, and a through-hole conductor for electrically connecting the surface-mounted electrode part and the inner conductor layer to each other has conventionally been known (see, for example, Japanese Patent Application Laid-Open No. 2008-186962). In the electronic component mounting structure, a cavity is formed in the main face of the multilayer substrate, while a plurality of capacitors having different capacitances are connected together so as to be arranged two-dimensionally within the cavity.

SUMMARY OF THE INVENTION

The above-mentioned electronic component mounting structure has been problematic in terms of space saving, since the capacitors having different capacitances are arranged two-dimensionally and thus occupy a large area in the multilayer substrate, Such a problem occurs in particular when the capacitor having a greater capacitance is of a high capacity type having a large size. When the capacitors are arranged densely in order to save the space, magnetic fluxes may enhance each other because of the mutual inductance between components, thereby increasing the ESL. Such a problem becomes remarkable in particular when a capacitor having a large capacitance is contained.

For solving the problems mentioned above, it is an object of the present invention to provide an electronic component mounting structure which can reduce the ESL while saving the space when mounting electronic components.

The electronic component mounting structure in accordance with the present invention comprises a first electronic component including a first capacitor having first terminal electrodes formed at respective end faces of an element body opposing each other and metal terminals electrically connected to the respective first terminal electrodes; a second electronic component including a second capacitor having second terminal electrodes formed at respective end faces of an element body opposing each other; and a multilayer substrate including respective surface-mounted electrode parts electrically connected to the first and second electronic components, an inner conductor part disposed within the substrate, and respective through-hole conductor parts, disposed within the substrate, for electrically connecting the first and second electronic components to the inner conductor part; wherein the first electronic component is electrically connected to the surface-mounted electrode part at the metal terminal such that the first capacitor and a mounting surface of the multilayer substrate are separated from each other; wherein the second electronic component is arranged between the first capacitor and the mounting surface of the multilayer substrate and electrically connected to the surface-mounted electrode part at the second terminal electrode; wherein the second electronic component overlaps the first capacitor when seen in a laminating direction of the multilayer substrate; wherein the first capacitor has a capacitance greater than that of the second capacitor; wherein the first electronic component is mounted to the multilayer substrate such that the first terminal electrodes oppose each other in a predetermined direction; and wherein the second electronic component is mounted to the multilayer substrate such that the second terminal electrodes oppose each other in the predetermined direction.

In this electronic component mounting structure, the first electronic component is electrically connected to the surface-mounted electrode part at the metal terminal such that the first capacitor having a greater capacitance and the mounting surface of the multilayer substrate are separated from each other. The second electronic component is arranged between the first capacitor and the mounting surface and electrically connected to the surface-mounted electrode part at the second terminal electrode. The second electronic component overlaps the first capacitor when seen in the laminating direction. Therefore, the capacitors can be mounted in a two-tier structure to the mounting surface of the multilayer substrate, so as to improve the package density in a limited space. This can save the space when mounting electronic components without arranging them too densely. The first electronic component is mounted to the multilayer substrate such that the first terminal electrodes oppose each other in a predetermined direction. The second electronic component is mounted to the multilayer substrate such that the second terminal electrodes oppose each other in the predetermined direction. Such arrangements can achieve a structure in which the surface-mounted electrode part and through-hole conductor part for the first electronic component and the surface-mounted electrode part and through-hole conductor part for the second electronic component are adjacent to each other. Also, a current flowing through the first capacitor and a current flowing through the second capacitor can be directed parallel to each other. Therefore, the surface-mounted electrode part and through-hole conductor part for the second electronic component can attain a polarity different from that of the surface-mounted electrode part and through-hole conductor part for the first electronic component. Since the through-hole conductor part for the first electronic component and the through-hole conductor part for the second electronic component are adjacent to each other and have different polarities, their mutual inductance allows magnetic fluxes to cancel each other out, thereby reducing the ESL. Since the current flowing through the first capacitor and the current flowing through the second capacitor are directed parallel to each other, they can be made opposite to each other, so that their mutual inductance allows magnetic fluxes to cancel each other out, thereby reducing the ESL. In the present invention, the first capacitor of the first electronic component has a capacitance greater than that of the second capacitor, so that the ESL tends to increase in particular, whereby the ESL reducing effect becomes further effective. As in the foregoing, improving the package density without densely arranging the electronic components can reduce the ESL while saving the space when mounting the electronic components.

Preferably, the mounting structure has a plurality of second electronic components arranged between the first capacitor and the mounting surface, while each of the plurality of second electronic components is mounted to the multilayer substrate such that the second terminal electrodes thereof oppose each other in the predetermined direction. Therefore, a plurality of through-hole conductor parts connected to the second electronic components can be arranged adjacent to the through-hole conductor part connected to the first electronic component. That is, the number of through-hole conductor parts for the second electronic components which can cancel the magnetic flux of the through-hole conductor part for the first electronic component can be increased. Also, the number of second capacitors which can cancel the magnetic flux of the current flowing through the first capacitor can be increased. This can improve the ESL reducing effect.

Preferably, the first capacitor overlaps the whole area of the second electronic component when seen in the laminating direction. When the second electronic component thus overlaps the first capacitor completely, the package density can further be improved.

Preferably, the multilayer structure is constructed as a package and electrically connected to a motherboard through a socket having an inner space, while the first and second electronic components are arranged in the inner space. The first electronic component thus arranged in the inner space can be mounted to the multilayer substrate even when made greater.

The present invention can reduce the ESL while saving the space when there are a plurality of capacitors having different capacitances.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, preferred embodiments of the present invention will be explained in detail with reference to the accompanying drawings. In the explanation, the same constituents or those having the same functions will be referred to with the same signs while omitting their overlapping descriptions.

Figure 1:
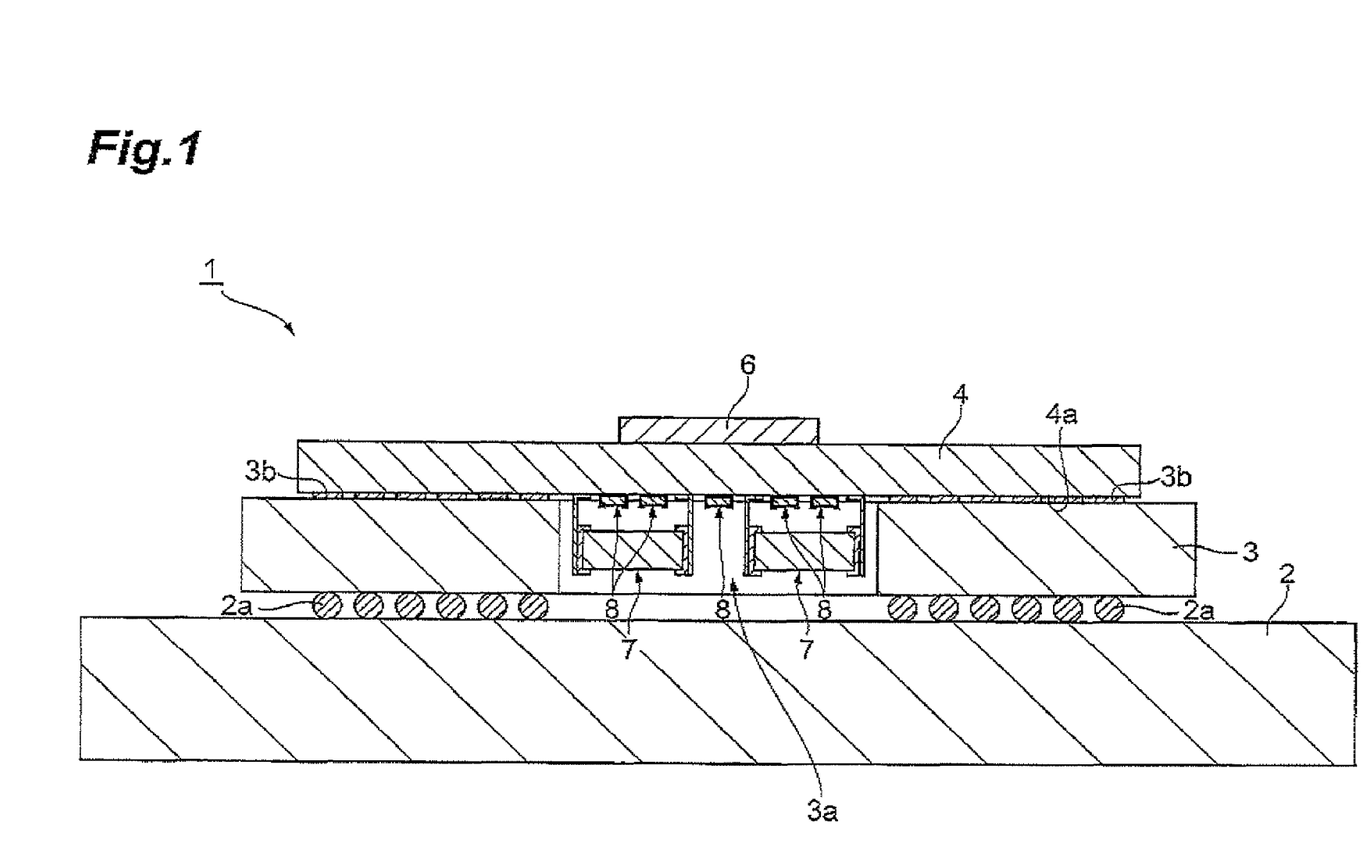
FIG. 1 is a sectional view illustrating the electronic component mounting structure in accordance with an embodiment.
Figure 2:
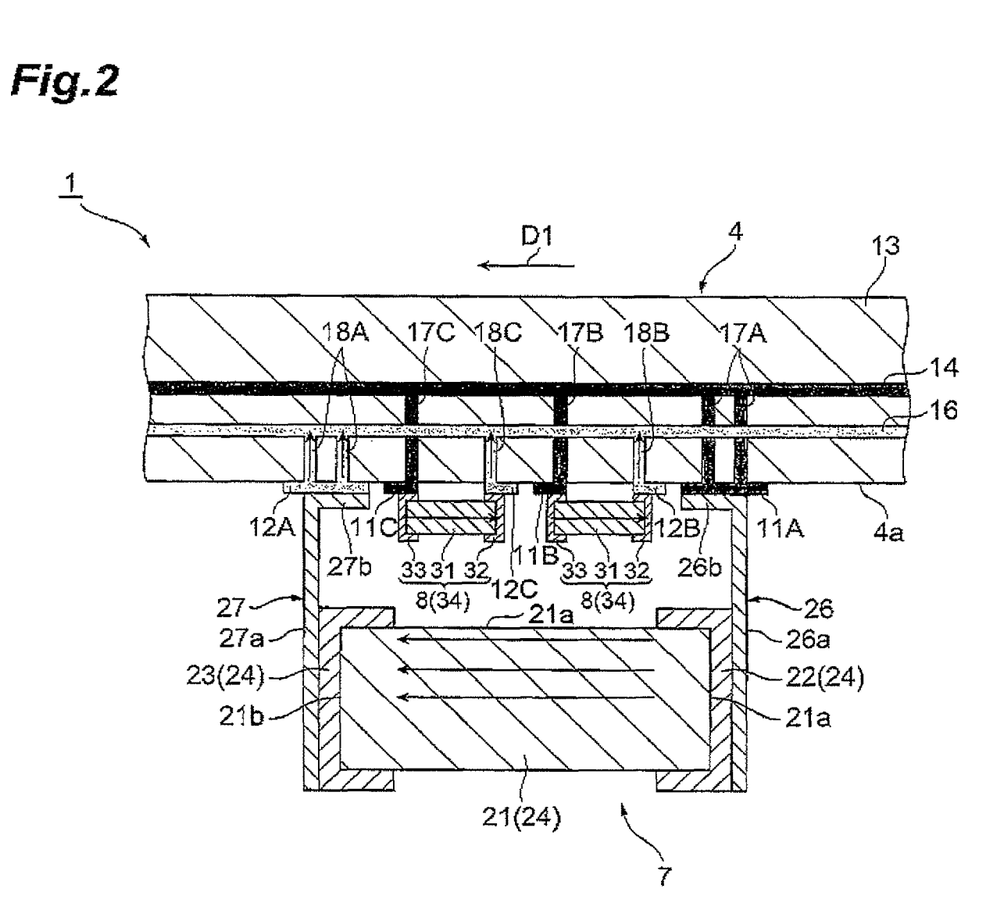
FIG. 2 is an enlarged sectional view of first and second electronic components in the electronic component mounting structure illustrated in FIG. 1.
Figure 3:
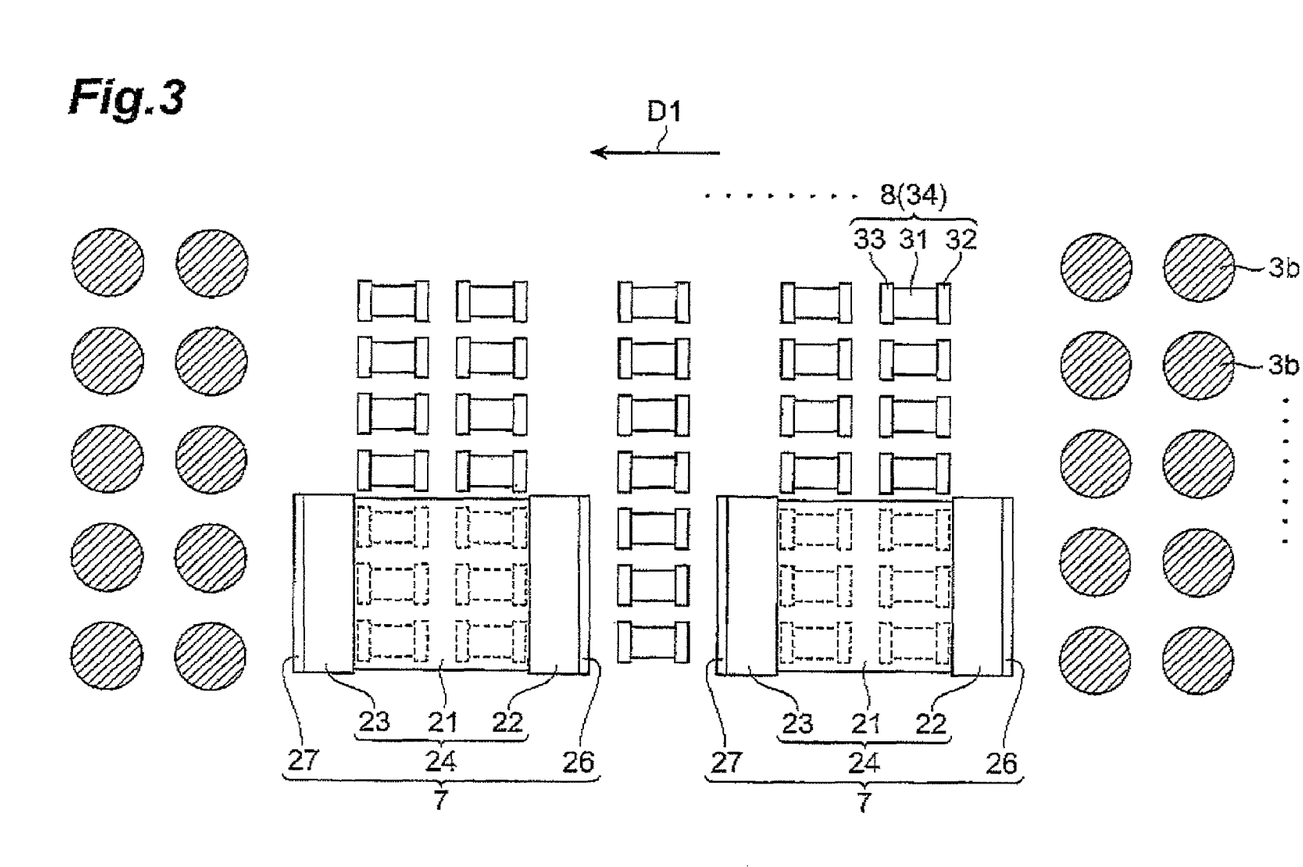
FIG. 3 is a view of the first and second electronic components in the electronic component mounting structure illustrated in FIG. 1 as seen from the lower side in the laminating direction.

With reference to FIGS. 1 to 3, the configuration of an electronic component mounting structure 1 in accordance with an embodiment of the present invention will be explained. FIG. 1 is a sectional view illustrating the electronic component mounting structure 1 in accordance with this embodiment. FIG. 2 is an enlarged sectional view of first and second electronic components 7, 8 in the electronic component mounting structure 1 illustrated in FIG. 1. FIG. 3 is a view of the first and second electronic components 7, 8 in the electronic component mounting structure 1 illustrated in FIG. 1 as seen from the lower side in the laminating direction. FIG. 1 omits the inner electrodes of first and second capacitors 24, 34, inner conductor parts within a multilayer substrate 4, and the like. FIG. 2 omits the inner electrodes of the first and second capacitors.

As illustrated in FIG. 1, the electronic component mounting structure 1 comprises a motherboard 2, a socket 3 arranged on the motherboard 2, the multilayer substrate 4 electrically connected to the motherboard 2 through the socket 3, a semiconductor 6 connected onto the multilayer substrate 4, and the first and second electronic components 7, 8 electrically connected to the lower face of the multilayer substrate 4. The socket 3 is electrically connected to the motherboard 2 through electrode parts 2a. The socket 3 has an inner space 3a formed by a rectangular through hole at the center position thereof. The multilayer substrate 4 is a package (interposer) or the like mounted on the motherboard 2 and constructed by forming a plurality of ceramic green sheets with electrode patterns and laminating them. The multilayer substrate 4 is electrically connected to the upper face of the socket 3 through electrode parts 3b. The first and second electronic components 7, 8 are mounted to the lower face 4a of the multilayer substrate 4 at the center position thereof. The first and second electronic components 7, 8 are arranged in the inner space 3a of the socket 3.

As illustrated in FIG. 2, the multilayer substrate 4 comprises surface-mounted electrode parts 11, 12 electrically connected to the first and second electronic components 7, 8; inner conductor parts 14, 16 disposed within the substrate 13; and through-hole conductor parts 17, 18, disposed within the substrate 13, for connecting the fast and second electronic components 7, 8 to the inner conductor parts 14, 16. In the area illustrated in FIG. 2, first surface-mounted electrode parts 11A, 11B, 11C and second surface-mounted electrode parts 12A, 12B, 12C are formed on the mounting surface 4a of the multilayer substrate 4. On the substrate, pairs of electrodes are formed by the first and second surface-mounted electrode parts 11A, 12A; 11B, 12B; and 11C, 12C. The surface-mounted electrode parts 11B, 12B; 11C, 12C are arranged between the first and second surface-mounted electrode parts 11A, 12A. The first surface-mounted electrode part 11A is adjacent to the second surface-mounted electrode part 12B, while the second surface-mounted electrode part 12A is adjacent to the first surface-mounted electrode part 11C. Within the substrate 13, the first and second inner conductor parts 14, 16 are formed on respective layers different from each other. First through-hole conductor parts 17A electrically connect the first surface-mounted electrode part 11A and the first inner conductor part 14 to each other. A first through-hole conductor part 17B electrically connects the first surface-mounted electrode part 11B and the first inner conductor part 14 to each other. A first through-hole conductor part 17C electrically connects the first surface-mounted electrode part 11C and the first inner conductor part 14 to each other. Second through-hole conductor parts 18A electrically connect the second surface-mounted electrode part 12A and the second inner conductor part 16 to each other. A second through-hole conductor part 18B electrically connects the second surface-mounted electrode part 12B and the second inner conductor part 16 to each other. A second through-hole conductor part 18C electrically connects the second surface-mounted electrode part 12C and the second inner conductor part 16 to each other. The foregoing structure allows the first surface-mounted electrode parts 11A, 11B, 11C, first through-hole conductor parts 17A, 17B, 17C, and first inner conductor part 14 to have the same polarity, which constitutes an anode in this embodiment. The second surface-mounted electrode parts 12A, 12B, 12C, second through-hole conductor parts 18A, 18B, 18C, and second inner conductor part 16 have the same polarity, which constitutes a cathode in this embodiment. The first surface-mounted electrode part 11A and first through-hole conductor parts 17A are adjacent to the second surface-mounted electrode part 12B and second through-hole conductor part 18B having a different polarity. The second surface-mounted electrode part 12A and second through-hole conductor parts 18A are adjacent to the first surface-mounted electrode part 11C and first through-hole conductor part 17C having a different polarity.

The first electronic component 7 has the first capacitor 24 in which an element body 21 is formed with first terminal electrodes 22, 23 and metal terminals 26, 27 electrically connected to the respective first terminal electrodes 22, 23. The first capacitor 24, which is a so-called multilayer chip capacitor, comprises the element body 21 constructed into a substantially rectangular parallelepiped form by laminating a plurality of planar ceramic green sheets formed with electrode patterns for inner electrodes and integrating them and the first terminal electrodes 22, 23 respectively formed on end faces 21a, 21b of the element body 21 opposing each other. The element body 21 is set to a size of 5.7×5.0×2.5 mm, for example. The first terminal electrodes 22, 23 are formed by attaching a conductive paste mainly composed of Cu, Ni, Ag, Pd, or the like to the outer surfaces of the end faces 21a, 21b of the element body 21 by dipping or the like, then burning them at a predetermined temperature, and subjecting thus burned electrodes to plating. The thickness of each of the first terminal electrodes 22, 23 is set to 10 to 30 μm. Each of the metal terminals 26, 27 is a planar member which is bent such as to have an L-shaped cross section. Each of the metal terminals 26, 27 is mainly composed of phosphor bronze and has a thickness of 100 to 200 μm. Planar parts 26a, 27a of the metal terminals 26, 27 are electrically connected to the respective first terminal electrodes 22, 23. A bent part 26b of the metal terminal 26 is electrically connected to the first surface-mounted electrode part 11A. On the other hand, a bent part 27b of the metal terminal 27 is electrically connected to the second surface-mounted electrode part 12A. The first electronic component 7 is connected to the surface-mounted electrode parts 11, 12 through the metal terminals 26, 27. Therefore, the first capacitor 24 is arranged so as to be separated from the mounting surface 4a of the multilayer substrate 4. Specifically, the side face 21a of the element body 21 of the first capacitor 24 and the mounting surface 4a are separated from each other by 0.8 to 1.5 mm. When the direction from the first surface-mounted electrode part 11A to the second surface-mounted electrode part 12A is defined as "a predetermined direction D1", the first electronic component 7 is mounted to the multilayer substrate 4 such that the first terminal electrodes 22, 23 oppose each other in the predetermined direction D1.

Each second electronic component 8 is constituted by the second capacitor 34 in which an element body 31 is formed with second terminal electrodes 32, 33. The second capacitor 34, which is a multilayer chip capacitor as with the first capacitor 24, comprises second terminal electrodes 32, 33 formed at respective end faces of the element body 31 opposing each other. The element body 31 is set to a size of 0.6× 0.3×0.3 mm to 1.0×0.5×0.5 mm. The thickness of each of the second terminal electrodes 32, 33 is set to 10 to 30 μm. The second electronic component 8 is arranged between the first capacitor 24 of the first electronic component 7 and the mounting surface 4a of the multilayer substrate 4. As illustrated in FIG. 3, the second electronic component 8 overlaps the first capacitor 24 when seen in the laminating direction of the multilayer substrate 4. The whole area of the second electronic component 8 completely overlaps the first capacitor 24. A plurality of second electronic components 8 are arranged for one first capacitor 24. In this embodiment, six second electronic components 8 overlap one first capacitor 24. For one first capacitor 24, two second electronic components 8 are arranged in the predetermined direction D1, while three second electronic components 8 are arranged in a direction orthogonal to the predetermined direction D1. That is, three second electronic components 8 are adjacent to one metal terminal 26, and three second electronic components 8 are adjacent to one metal terminal 27. In each of the second electronic components 8 arranged on the metal terminal 26 side, the second terminal electrode 32 is electrically connected to the second surface-mounted electrode part 12B, while the second terminal electrode 33 is electrically connected to the first surface-mounted electrode part 11B. In each of the second electronic components 8 arranged on the metal terminal 27 side, the second terminal electrode 32 is electrically connected to the second surface-mounted electrode part 12C, while the second terminal electrode 33 is electrically connected to the first surface-mounted electrode part 11C. As a consequence, each second electronic component 8 is mounted to the multilayer substrate 4 such that the second terminal electrodes 32, 33 oppose each other in the predetermined direction D1. That is, the second electronic component 8 is arranged such that the longitudinal direction of the second capacitor 34 coincides with that of the first capacitor 24 of the first electronic component 7.

The first capacitor 24 has a capacitance greater than that of the second capacitor 34. Specifically, the capacitance of the first capacitor 24 is 10 to 100 μF, while the capacitance of the second capacitor 34 is 0.1 to 1.0 μF.

Directions of currents flowing through the electronic component mounting structure 1 illustrated in FIG. 2 will now be explained. The metal terminal 26 and first terminal electrode 22 are connected to the first surface-mounted electrode part 11A acting as the anode, while the metal terminal 27 and first terminal electrode 23 are connected to the second surface-mounted electrode part 12A acting as the cathode. Therefore, currents flow through the first capacitor 24 in the predetermined direction D1. Downward currents flow through the first through-hole conductor parts 17A, while upward currents flow through the second through-hole conductor parts 18A. The second terminal electrodes 32 are connected to the second surface-mounted electrode parts 12B, 12C acting as the cathode, while the second terminal electrodes 33 are connected to the first surface-mounted electrode parts 11B, 11C acting as the anode. Therefore, currents flow through the second capacitors 34 in a direction opposite to the predetermined direction D1. Upward currents flow through the second through-hole conductor parts 18B, 18C, while downward currents flow through the first through-hole conductor parts 17B, 17C.

Operations and effects of the electronic component mounting structure 1 in accordance with this embodiment will now be explained.

Figure 4:
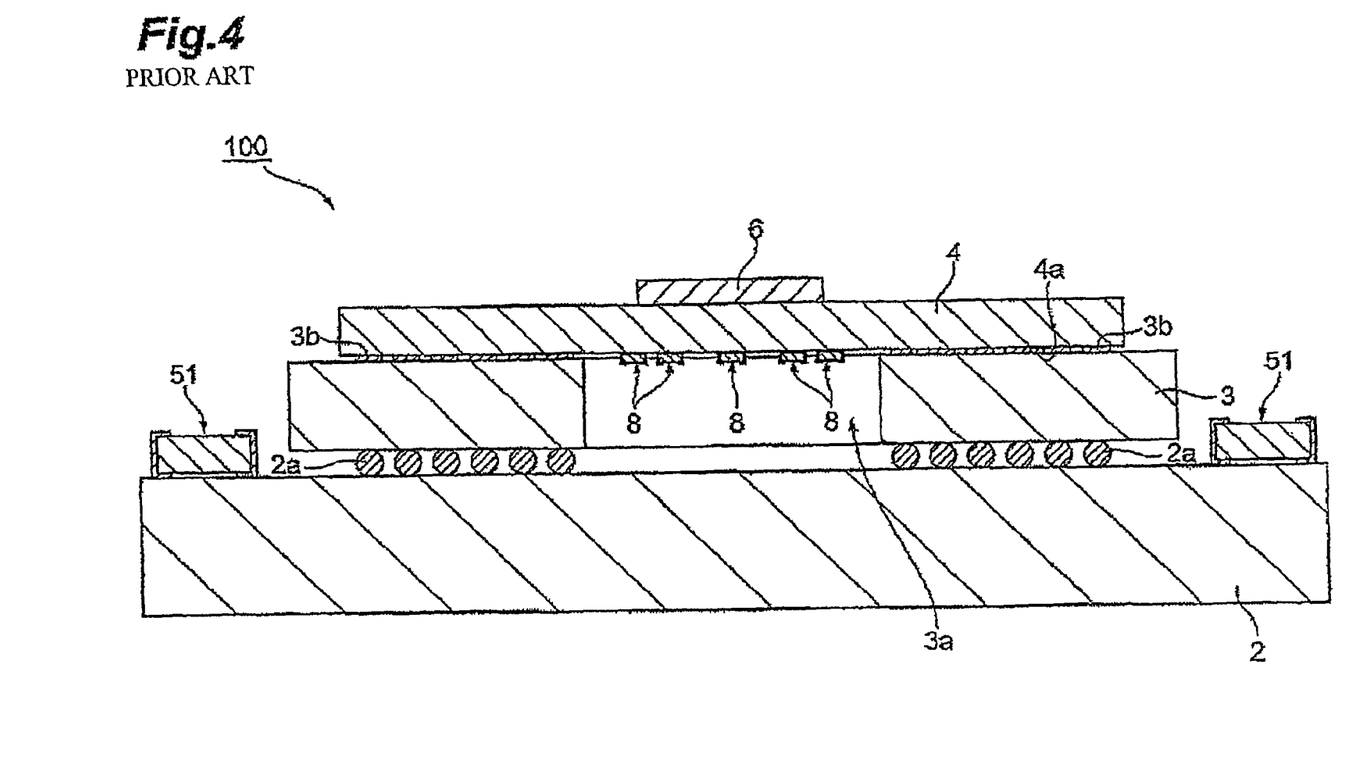
FIG. 4 is a sectional view illustrating the electronic component mounting structure in accordance with a conventional example.

FIG. 4 is a sectional view of an electronic component mounting structure 100 in accordance with a conventional example. As illustrated in FIG. 4, the conventional electronic component mounting structure 100 has no space for simultaneously mounting large electronic components 51 and small second electronic components 8 to the mounting surface 4a of the multilayer substrate 4, and therefore mounts the large electronic components 51 to the motherboard 2. Hence, it has been required to save the space for mounting electronic components. When saving the space by reducing the interval between electronic components on the mounting surface 4a of the multilayer substrate 4, the mutual inductance between the components may let magnetic fluxes enhance each other, thereby increasing the ESL.

In the electronic component mounting structure 1 in accordance with this embodiment, as illustrated in FIG. 2, the first electronic component 7 is electrically connected to the first and second surface-mounted electrode parts 11A, 12A at the metal terminals 26, 27, respectively, such that the first capacitor 24 having a greater capacitance and the mounting surface 4a of the multilayer substrate 4 are separated from each other. The second electronic component 8 is arranged between the first capacitor 24 and the mounting surface 4a, electrically connected to the second surface-mounted electrode part 12B at the second terminal electrode 32, and electrically connected to the first surface-mounted electrode part 11B at the second terminal electrode 33. The second electronic component 8 overlaps the first capacitor 24 when seen in the laminating direction. Therefore, the capacitors can be mounted in a two-tier structure to the mounting surface 4a of the multilayer substrate 4, so as to improve the package density in a limited space. This can save the space when mounting electronic components without arranging them too densely.

In the electronic component mounting structure 1 in accordance with this embodiment, the first electronic component 7 is mounted to the multilayer substrate 4 such that the first terminal electrodes 22, 23 oppose each other in the predetermined direction D1. Each second electronic component 8 is mounted to the multilayer substrate 4 such that the second terminal electrodes 32, 33 oppose each other in the predetermined direction D1. Such arrangements can achieve a structure in which the surface-mounted electrode parts and through-hole conductor parts for the first electronic component 7 and the surface-mounted electrode parts and through-hole conductor parts for the second electronic components 8 are adjacent to each other. Also, each current flowing through the first capacitor 24 and each current flowing through the second capacitors 34 can be directed parallel to each other. Therefore, the surface-mounted electrode parts and through-hole conductor parts for the second electronic components 8 can attain a polarity different from that of the surface-mounted electrode parts and through-hole conductor parts for the first electronic component 7. Since the through-hole conductor parts for the first electronic component 7 and the through-hole conductor parts for the second electronic component 34 are adjacent to each other and have different polarities, their mutual inductance allows magnetic fluxes to cancel each other out, thereby reducing the ESL. When the current flowing through the first capacitor 24 and the current flowing through the second capacitor 34 are directed parallel to each other, they can be made opposite to each other, so that their mutual inductance allows magnetic fluxes to cancel each other out, thereby reducing the ESL. In this embodiment, the first capacitor 24 of the first electronic component 7 has a capacitance greater than that of the second capacitor 34, so that the ESL tends to increase in particular, whereby the ESL reducing effect becomes further effective.

Figure 5:
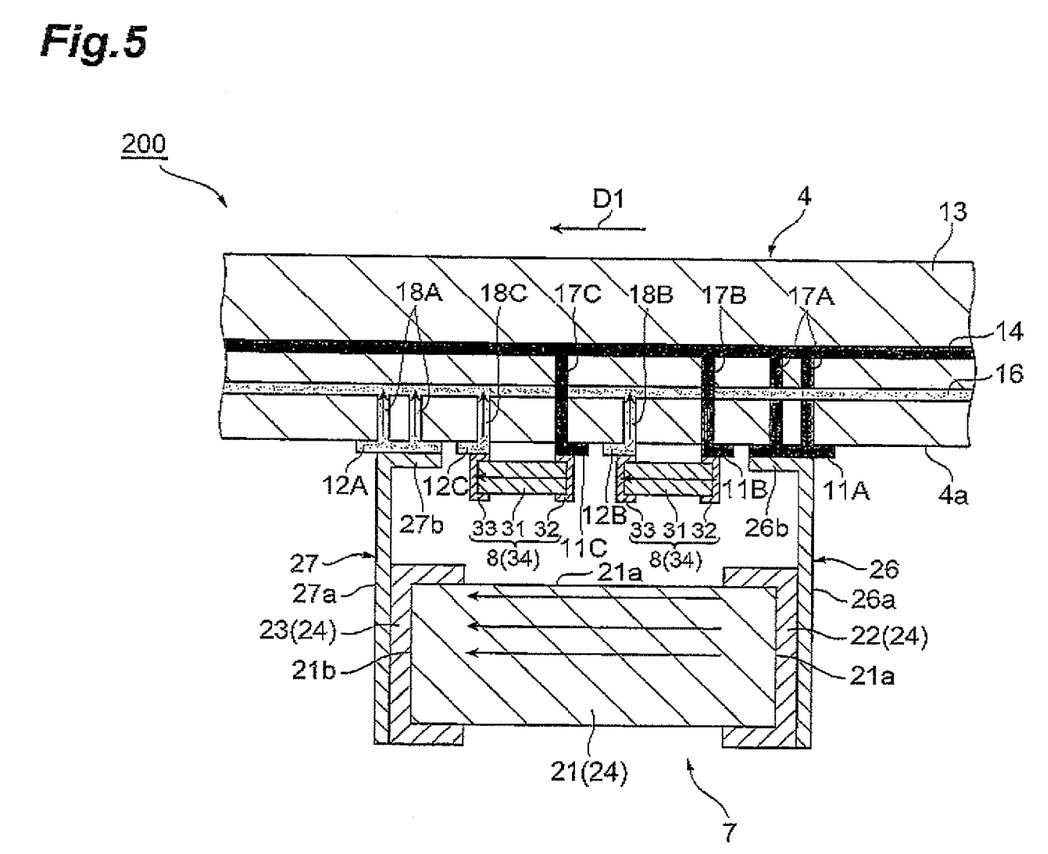
FIG. 5 is an enlarged sectional view of the electronic component mounting structure illustrating the wiring structure in accordance with a comparative example.

The ESL reducing effect will now be explained specifically with reference to FIGS. 2 and 5. FIG. 5 is an enlarged sectional view of an electronic component mounting structure 200 illustrating the wiring structure in accordance with a comparative example. In the electronic component mounting structure 200 in accordance with, the comparative example, the positions of the first surface-mounted electrode parts 11B, 11C acting as the anode and the positions of the second surface-mounted electrode parts 12B, 12C acting as the cathode are in the reversal of those in the electronic component mounting structure 1 in accordance with this embodiment. The first surface-mounted electrode part 11B and first through-hole conductor part 17B acting as the anode for mounting the second terminal electrode 32 of the second electronic component 8 are adjacent to the first surface-mounted electrode part 11A and first through-hole conductor parts 17A acting as the anode for mounting the metal terminal 26 of the first electronic component 7. The second surface-mounted electrode part 12C and second through-hole conductor part 18C acting as the cathode for mounting the second terminal electrode 32 of the second electronic component 8 are adjacent to the second surface-mounted electrode part 12A and second through-hole conductor parts 18A acting as the anode for mounting the metal terminal 27 of the first electronic component 7. This is a structure in which the through-hole conductor parts having the same polarity are adjacent to each other. Therefore, the mutual inductance between the first through-hole conductor parts 17A, 17B allows magnetic fluxes to enhance each other, thereby increasing the ESL. Also, the mutual inductance between the second through-hole conductor parts 18A, 18C allows magnetic fluxes to enhance each other, thereby increasing the ESL. Currents flow through the first and second capacitors 24, 34 in the predetermined direction D1. Their mutual inductance allows magnetic fluxes to enhance each other, thereby increasing the ESL.

In the electronic component mounting structure 1 in accordance with this embodiment, on the other hand, the second surface-mounted electrode part 12B and second through-hole conductor part 18B acting as the cathode for mounting the second terminal electrode 32 of the second electronic component 8 are adjacent to the first surface-mounted electrode part 11A and through-hole conductor parts 17A acting as the anode for mounting the metal terminal 26 of the first electronic component 7. The first surface-mounted electrode part 11C and first through-hole conductor part 17C acting as the anode for mounting the second terminal electrode 33 of the second electronic component 8 are adjacent to the second surface-mounted electrode part 12A and second through-hole conductor parts 18A acting as the cathode for mounting the metal terminal 27 of the first electronic component 7. This is a structure in which the through-hole conductor parts having different polarities are adjacent to each other. Therefore, the mutual inductance between the first and second through-hole conductor parts 17A, 18B allows magnetic fluxes to cancel each other out, thereby reducing the ESL. The mutual inductance between the first and second through-hole conductor parts 17C, 18A allows magnetic fluxes to cancel each other out, thereby reducing the ESL. Currents flow through the first capacitor 24 in the predetermined direction D1, while currents flow through the second capacitors 34 in a direction opposite to the predetermined direction D1. Their mutual inductance allows magnetic fluxes to cancel each other out, thereby reducing the ESL.

As in the foregoing, the electronic component mounting structure 1 in accordance with this embodiment can improve the package density without arranging components densely, so as to reduce the ESL while saving the space when mounting electronic components.

In the electronic component mounting structure 1 in accordance with this embodiment, a plurality of second electronic components 8 are arranged between one first capacitor 24 and the mounting surface 4*a*. Therefore, a plurality of through-hole conductor parts connected to the second electronic components 8 can be arranged adjacent to the through hole conductor part connected to the first electronic component 7. That is, the number of through-hole conductor parts for the second electronic components 8 which can cancel the magnetic flux of the through-hole conductor part for the first electronic component 7 can be increased. Also, the number of second capacitors 34 which can cancel magnetic fluxes of currents flowing through the first capacitor 24 can be increased. This can improve the ESL reducing effect.

In the electronic component mounting structure 1 in accordance with this embodiment, the first capacitor 24 overlaps the whole area of each second electronic component 8 when seen in the laminating direction. When the second electronic component 8 thus overlaps the first capacitor 24 completely, the package density can further be improved.

In the electronic component mounting structure 1 in accordance with this embodiment, the first and second electronic components 7, 8 are arranged in the inner space 3*a* of the socket 3. The first electronic component 7 thus arranged in the inner space 3*a* can be mounted to the multilayer substrate 4 even when made greater.

The present invention is not limited to the above-mentioned embodiments. For example, though six second electronic components 8 overlap one first capacitor 24 in the above-mentioned embodiment, their number may be more or less than that or just one.

Though the multilayer substrate 4 is employed for the package mounted to the motherboard 2 through the socket 3 as an example of the electronic component mounting structure in accordance with the present invention, the multilayer substrate to which the structure of the present invention is applicable is not limited thereto.

What is claimed is:

1. An electronic component mounting structure comprising:
   a first electronic component including a first capacitor having first terminal electrodes formed at respective end faces of an element body opposing each other and metal terminals electrically connected to the respective first terminal electrodes;
   a second electronic component including a second capacitor having second terminal electrodes formed at respective end faces of an element body opposing each other; and
   a multilayer substrate including respective surface-mounted electrode parts electrically connected to the first and second electronic components, an inner conductor part disposed within the substrate, and respective through-hole conductor parts, disposed within the substrate, for electrically connecting the surface-mounted electrode parts to the inner conductor part;
   wherein the first electronic component is electrically connected to the surface-mounted electrode part at the metal terminal such that the first capacitor and a mounting surface of the multilayer substrate are separated from each other;
   wherein the second electronic component is arranged between the first capacitor and the mounting surface of the multilayer substrate and electrically connected to the surface-mounted electrode part at the second terminal electrode;
   wherein the second electronic component overlaps the first capacitor when seen in a laminating direction of the multilayer substrate;
   wherein the first capacitor has a capacitance greater than that of the second capacitor;
   wherein the first electronic component is mounted to the multilayer substrate such that the first terminal electrodes oppose each other in a predetermined direction; and
   wherein the second electronic component is mounted to the multilayer substrate such that the second terminal electrodes oppose each other in the predetermined direction.

2. An electronic component mounting structure according to claim 1, wherein the mounting structure has a plurality of second electronic components arranged between the first capacitor and the mounting surface; and
   wherein each of the plurality of second electronic components is mounted to the multilayer substrate such that the second terminal electrodes thereof oppose each other in the predetermined direction.

3. An electronic component mounting structure according to claim 1, wherein the first capacitor overlaps the whole area of the second electronic component when seen in the laminating direction.

4. An electronic component mounting structure according to claim 1, wherein the multilayer structure is constructed as a package and electrically connected to a motherboard through a socket having an inner space; and
   wherein the first and second electronic components are arranged in the inner space.

* * * * *